United States Patent
Chang

(10) Patent No.: US 7,676,918 B2
(45) Date of Patent: Mar. 16, 2010

(54) METHOD FOR FORMING A MOLDED CIRCUIT BOARD

(75) Inventor: Jung-Chien Chang, Xinzhuang (TW)

(73) Assignee: Mutual-Tek Industries Co., Ltd, Xinzhuang (TW)

( * ) Notice: Subject to any disclaimer, the term of this patent is extended or adjusted under 35 U.S.C. 154(b) by 54 days.

(21) Appl. No.: 11/776,754

(22) Filed: Jul. 12, 2007

(65) Prior Publication Data

US 2008/0012154 A1 Jan. 17, 2008

(30) Foreign Application Priority Data

Jul. 12, 2006 (TW) .............................. 95125534 A

(51) Int. Cl.
*H01K 3/22* (2006.01)
(52) U.S. Cl. .............................. 29/848; 29/841; 29/846; 29/849; 257/E23.006; 257/E23.177; 264/135; 264/255; 264/476

(58) Field of Classification Search .................... 29/848, 29/423, 424, 620, 841, 846, 849; 257/717, 257/787, E23.006, E23.038, E23.177; 264/132, 264/135, 232, 233, 255, 278, 478
See application file for complete search history.

(56) References Cited

U.S. PATENT DOCUMENTS

| 3,039,177 A | * | 6/1962 | Burdett ........................ 29/848 |
| 4,944,908 A | | 7/1990 | Leveque et al. |
| 5,452,182 A | * | 9/1995 | Eichelberger et al. ........ 361/749 |

* cited by examiner

*Primary Examiner*—Thiem Phan
(74) *Attorney, Agent, or Firm*—Snell & Wilmer L.L.P.

(57) ABSTRACT

A method for forming a molded circuit board is provided. The method includes the steps of forming a circuit having a first section and a second section on a conductive substrate, the first section and the second section being coplanar; then deforming the conductive substrate by mold-pressing, so that the first section and the second section become non-coplanar; providing a plastic material to cover the circuit and the conductive substrate; curing the plastic material by injection-molding; and removing the conductive substrate to expose the circuit. The molded circuit board made by this method is also provided.

7 Claims, 10 Drawing Sheets

METHOD FOR FORMING A MOLDED CIRCUIT BOARD

RELATED APPLICATION

This application claims the right of priority based on Taiwan Patent Application No. 095125534 entitled "MOLDED CIRCUIT BOARD AND METHOD FOR THE SAME", filed on Jul. 12, 2006, which is incorporated herein by reference and assigned to the assignee herein.

TECHNICAL FIELD

The present invention relates to a circuit board and more particularly to a circuit board made by mold-pressing.

BACKGROUND OF THE INVENTION

Conventional circuit boards are rigid and rectangular plates for providing well supports for circuits and electronic components disposed thereon. Since the circuit boards are typically flat and hard, to manipulate the contours of the electronic devices containing the circuit boards is difficult. Examples of devices containing such circuit boards are memories, network cards, display cards, sound cards, etc. In order to install the devices into computers, longitudinal sockets are specifically built on motherboards for receiving them and thus such an arrangement inevitably narrows the space for deploying other circuits or components on the motherboards. Furthermore, it should be noted that conventional motherboards are also flat and rigid plates, which similarly bother designers when contemplating styles of products containing such motherboards, especially the products in smaller size.

Accordingly, the conventional flat circuit boards are gradually being unsuitable for electronic products especially in smaller size. Therefore, it would be desirable to provide an improved circuit board to resolve the above-described problems.

SUMMARY OF THE INVENTION

The present invention provides a molded circuit board formed by mold-pressing, injection-molding, and transfer-printing techniques. The circuit on the molded circuit board is a three-dimensional structure. In other words, the circuit includes at least two sections that are non-coplanar. The contour of the molded circuit board can be flexibly designed and no longer restricted to the conventional flat plate. These benefits allow designers to position components or other circuits on the circuit boards in a more flexible manner, so as to enhance the exterior appearance of electronic products especially those with small sizes. More particularly, the present invention also provides a molded circuit board directly serving as a housing of an electronic product. It is advantageous to save space as well as reducing material cost.

One aspect of the invention is to provide a circuit board. The circuit board includes a plastic substrate formed by injection molding, the contour of the plastic substrate being defined by the injection molding; and a circuit embedded in the plastic substrate, the circuit having a first section and a second section non-coplanar with each other formed by mold-pressing. The circuit board can serve as a housing of an electronic apparatus. The electronic apparatus can be consumer electronics such as household appliances, communication appliances, computers, and handheld devices.

Another aspect of the invention is to provide a method for forming a molded circuit board including the steps of providing a conductive substrate; forming a circuit having a first section and a second section on the conductive substrate, the first section and the second section being coplanar; deforming the conductive substrate to make the first section and the second section non-coplanar by pressing the conductive substrate with a first lower mold and a first upper mold; applying a plastic material to cover the conductive substrate and the circuit; curing the plastic material to form a plastic substrate with the circuit therein; and removing the conductive substrate.

The terms "co-planar" and "non-coplanar" as used herein refer to FIGS. 1A to 1B.

FIG. 1A is a diagram illustrating a conventional flat circuit board, in which the first section 12 and the second section 13 of the circuit 11 are located on the same plane X. Therefore, the first section 12 and the second section 13 are defined as "coplanar." FIG. 1B is a diagram illustrating a molded circuit board in accordance with the present invention, in which the first section 12' and the second section 13' of the circuit 11' are respectively located on different planes Y and Z. Therefore, the first section 12' and the second section 13' are defined as "non-coplanar". In other words, the terms "coplanar" and "non-coplanar" as used herein should be determined in view of the circuit board as a whole rather than in part.

DETAILED DESCRIPTION OF THE PREFERRED EMBODIMENTS

Figure 1A:
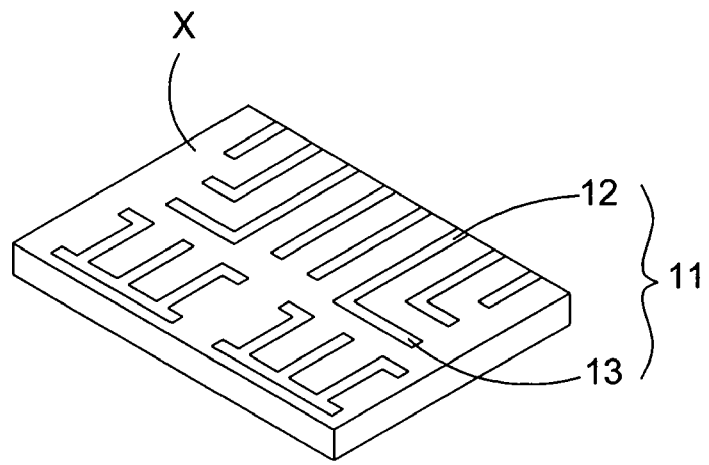
FIG. 1A is a diagram illustrating a conventional flat circuit board.
Figure 1B:
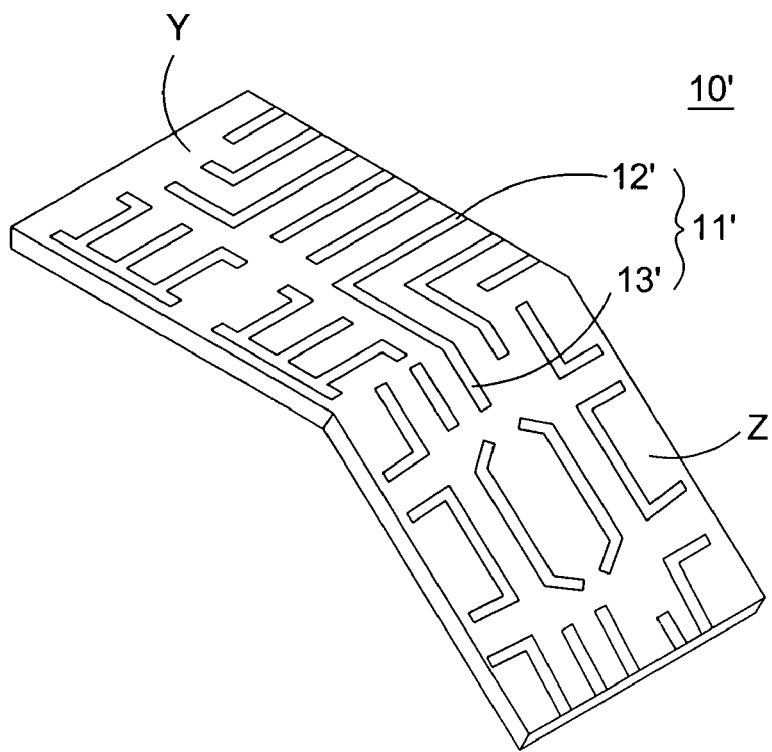
FIG. 1B is a diagram illustrating a molded circuit board in accordance with the present invention.

The preferred embodiments of the present invention will now be described in greater details by referring to the drawings that accompany the present application. It should be noted that the features illustrated in the drawings are not necessarily drawn to scale. Descriptions of well-known components, materials, and process techniques are omitted so as to not unnecessarily obscure the embodiments of the invention.

Figure 2:
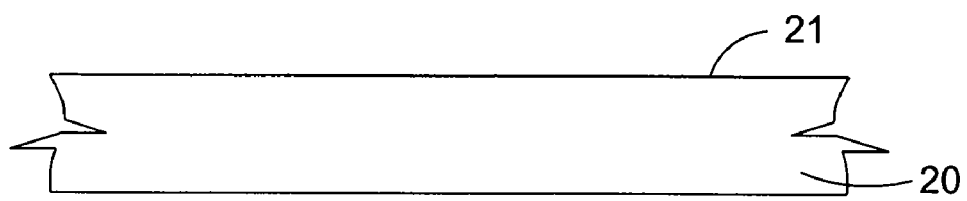
FIGS. 2 to 13 show the cross-sectional views of a molded circuit board during fabrication in accordance with a first embodiment of the present invention.

FIGS. 2 to 13 illustrates the cross-sectional views of a molded circuit board during fabrication in accordance with a first embodiment of the present invention. As shown in FIG. 2, a conductive substrate 20 having a flat plane 21 is provided. The conductive substrate 20 serves as a carrier for supporting a circuit to be made. Any suitable conductive material such as steel or copper can be used to form the conductive substrate 20. The thickness of the conductive substrate 20 can vary. In the specific embodiment, the thickness of the conductive substrate 20 is around 0.075 mm to 1 mm.

Figure 3:
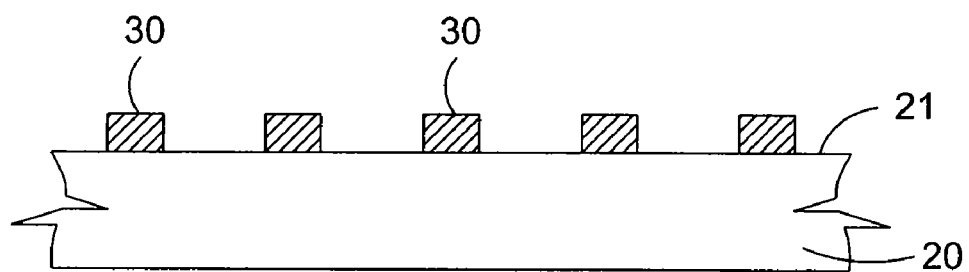
Figure 4:
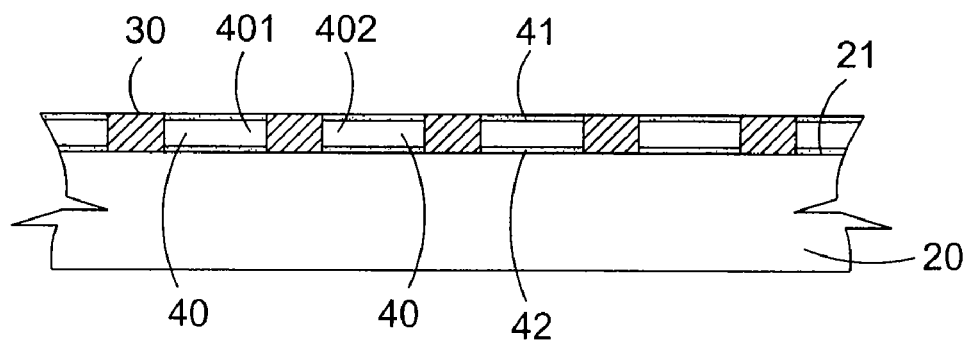

Subsequently, a patterned photoresist layer 30 is formed on the flat plane 21 of the conductive substrate 20, as shown in FIG. 3. The patterned photoresist layer 30 defines a circuit to be formed. The patterned photoresist layer 30 can be formed by well-known technology such as photolithography, imprinting, and screen-printing. Then, as shown in FIG. 4, a circuit 40 is formed on the conductive substrate 20 by using the patterned photoresist layer 30 as a mask. The circuit 40 can be formed by plating or any other suitable process using materials such as copper or any other conductive material as appropriate. The thickness of the circuit 40 is preferably between 0.2 mil to 2 mil. Note that the circuit 40 includes a first section 401 and a second section 402, which are both on the same plane 21. That is, the first section 401 and the second section 402 are coplanar. Following the step of forming the circuit 40, a barrier layer 41 can be optionally formed on the circuit 40 using the patterned photoresist layer 30 as a mask. The barrier layer 41 can also be formed by plating or any other suitable process. The barrier layer 41 can either protect the circuit 40 from corrosion or function as an adhesive layer to facilitate the adhesion between the circuit 40 and a subsequent layer to be formed thereon. Any suitable material exhibiting the above-described properties can be used as the barrier layer 41. The preferred thickness of the barrier layer 41 is thinner than that of the circuit 40. In the specific embodiment, the barrier layer 41 can be made of nickel. The barrier layer 41 can be extremely thin so as to be easily removed, if desired, in the following steps.

It is noted that prior to forming the circuit 40, an optional step of forming an etching stop layer 42 is also illustrated in FIG. 4. The etching stop layer 42 on the conductive layer 20 can be formed by plating or any other suitable process. The etching stop layer 42 functions as a protective layer to protect the circuit 40 from damage when the conductive substrate 20 is removed. The etching stop layer 42 can include nickel or any other suitable substances. The etching stop layer 42 is preferably thinner than the circuit 40. The etching stop layer 42 can be extremely thin so as to be removed easily, if desired, in the following steps.

Figure 5:
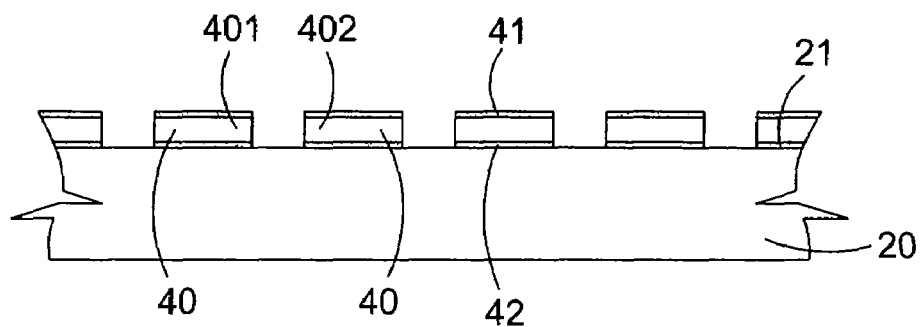
Figure 6:
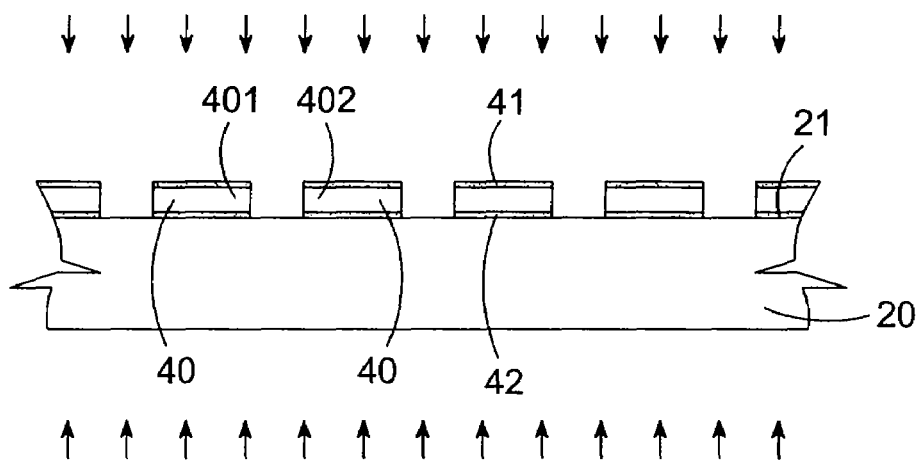

After forming the circuit 40 and the optional barrier layer 41 and the optional etching stop layer 42, the patterned photoresist layer 30 is removed by well-known etching process, and the resulted structure is shown in FIG. 5.

Next, a thermal treatment is performed on the conductive substrate 20 with the circuit 40 to prevent the conductive substrate 20 and the circuit 40 from crack in subsequent steps.

The thermal treatment is conducted at a temperature depending upon the materials of the conductive substrate 20 and the circuit 40. In the specific embodiment, the temperature is preferably between 300° C. to 400° C.

Figure 7:
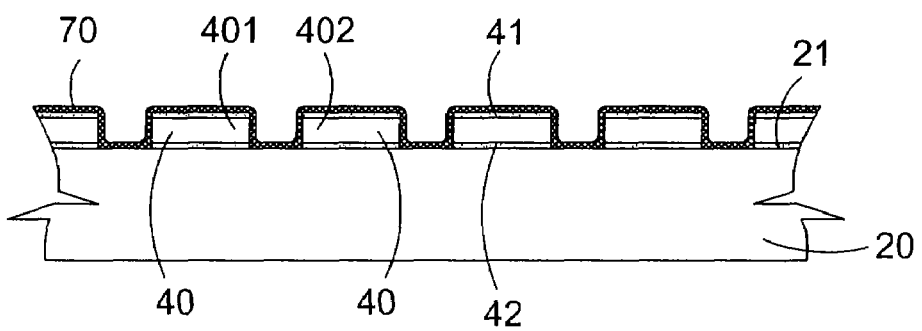

Subsequently, as shown in FIG. 7, an adhesive layer 70 is applied to cover the circuit 40 and the barrier layer 41 in order to enhance the connection between the circuit 40 and a subsequent layer to be formed. The adhesive layer 70 can be any suitable substances such as epoxy or polyimide. The thickness of the adhesive layer 70 is not critical as long as an appropriate adhesion can be achieved. Note that the adhesive layer 70 is optional. If the circuit 40 or the barrier layer 41 can established an appropriate adhesion with the subsequent layer, the adhesive layer 70 can be omitted.

Figure 8:
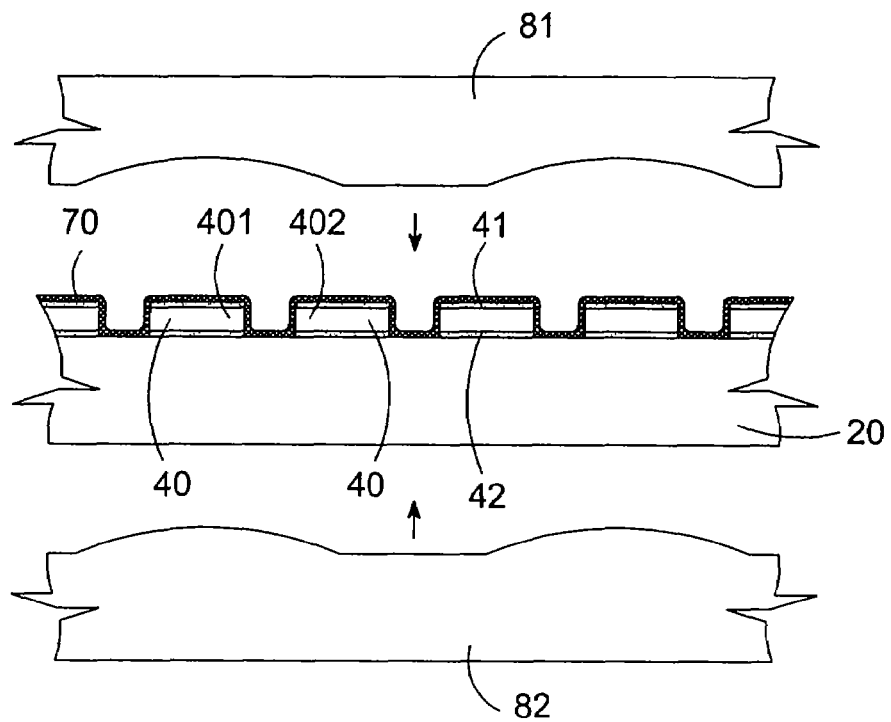
Figure 9:
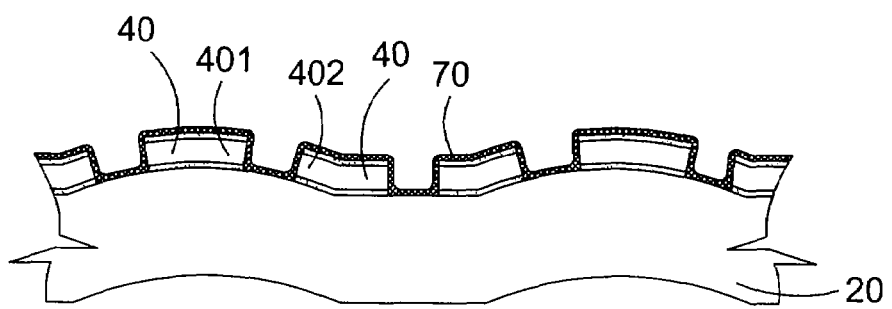

As shown in FIGS. 8 and 9, the conductive substrate 20 is deformed by pressing with molds 81 and 82 to make the first section 401 and the second section 402 non-coplanar. Specifically, as shown in FIG. 8, the conductive substrate 20 with the circuit 40 thereon is placed between the first upper mold 81 and the first lower mold 82. The first upper mold 81 and the first lower mold 82 together define a predetermined shape, such as a curve, for manipulating the arrangement of the circuit. When the first upper mold 81 and the first second mold 82 are pressed toward each other, the conductive substrate 20 is pressed and deformed, and the circuit 40 is accordingly bent, so that the first section 401 and the second section 402 become non-coplanar. Note that the contour of the conductive substrate 20 and the bending degree of the circuit 40 depend upon the first upper mold 81 and the second lower mold 82. While FIG. 8 illustratively demonstrates the first upper mold 81 and the first lower mold 82 to be arch structures, it is apparent that a person ordinarily skilled in the art can readily modify the exemplary arch structures to provide other non-coplanar circuit patterns in a three-dimensional style for different application requirements based on the above descriptions.

Figure 10:
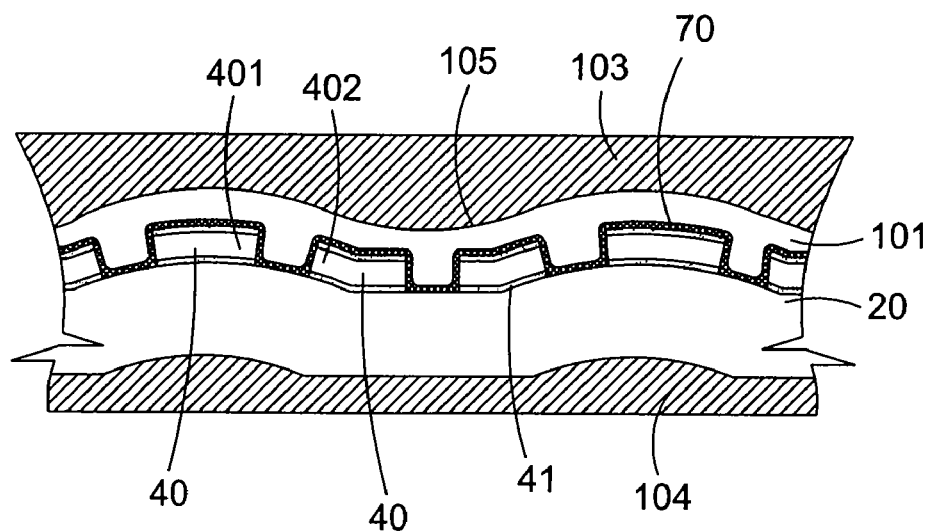
Figure 11:
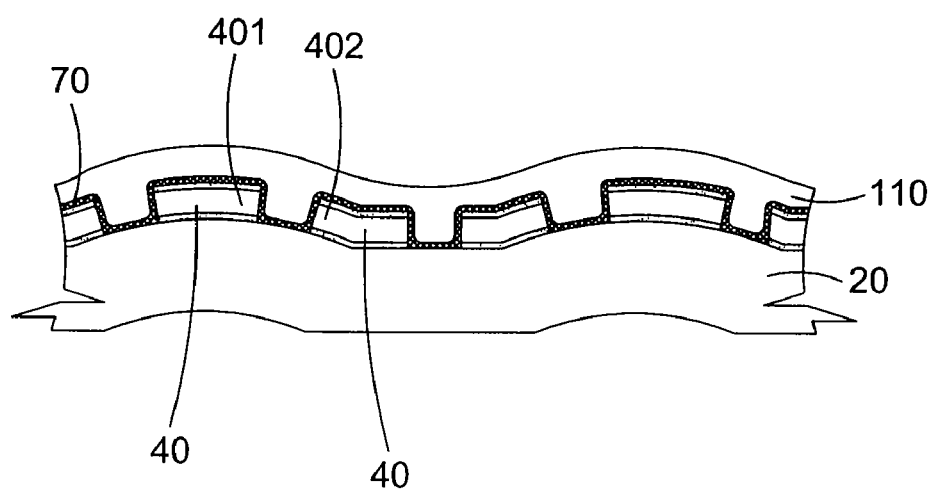

Referring to FIGS. 10 to 11, which show a plastic material 101 is injected on the deformed circuit 40. Specifically, as shown in FIG. 10, the deformed conductive substrate 20 with the circuit 40 is first placed between a second upper mold 103 and a second lower mold 104 and a space 105 is provided between the second upper mold 103 and the conductive substrate 20 with the circuit 40 thereon. The space is provided to receive the plastic material 101. The plastic material 101 in melt phase is then injected into the space 105 to cover the circuit 40, the conductive substrate 20, the optional adhesive layer 70 and the barrier layer 41 under high pressure. The plastic material 101 may include any suitable substances, including, but not limited to: Poly Carbonate (PC), PC with fibers, transparent Poly Vinyl Chloride (PVC), Polyetherimide (PEI), Poly phenylene sulfide (PPS), Polyoxymethylene (POM) or Poly butylene terephthalate (PBT), etc.

Next, as shown in FIG. 11, the plastic material 101 is cured to form a plastic substrate 110, and the second upper mold 103 and the second lower mold 104 are removed. Since the plastic substrate 110 is able to support the circuit 40 and any electronic components to be formed thereon, the plastic substrate 110 can replace the conductive substrate 20. In other words, the circuit 40 has been transferred from the conductive substrate 20 to the plastic substrate 110 through the above-described injection molding, and accordingly, the conductive substrate 20 can be removed. Note that the contour of the plastic substrate 110 depends upon configuration of the second upper mold 103. While the embodiment illustratively demonstrates the second upper mold 103 as an arch structure, it is apparent that a person ordinarily skilled in the art can readily modify the exemplary arch structure for different application requirements based on the above descriptions.

Figure 12:
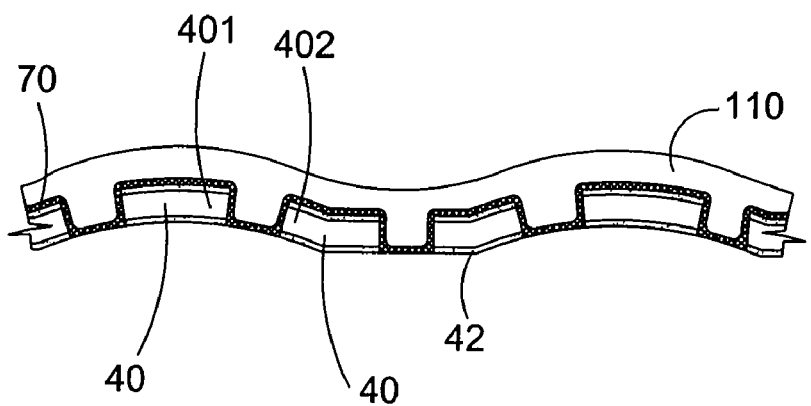

As shown in FIG. 12, after the plastic substrate 110 is formed, the conductive substrate 20 is then removed to expose the etching stop layer 42 or the circuit 40. The conductive substrate 20 can be removed by any suitable conventional technique, such as etching process. Although FIG. 12 illustratively demonstrates removing the entire conductive substrate 20, it should be appreciated by a person ordinarily skilled in the art that a portion of the conductive substrate 20 could be remained for other uses. For example, the remaining conductive substrate can be patterned as another level of circuit for different applications. That is, the structure with a patterned conductive substrate 20 is contemplated in the scope of the present invention. In addition, note that the etching stop layer 42 is remained in FIG. 12 while it can be removed, if desired, by conventional techniques, such as a wet etching process.

Figure 13:
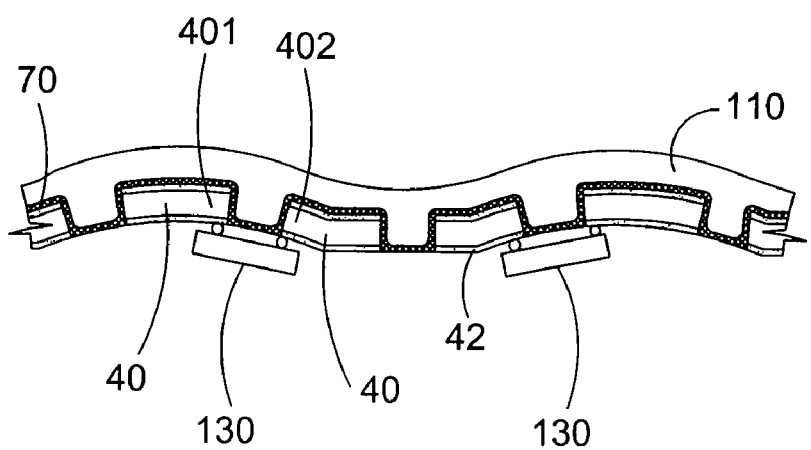

As shown in FIG. 13, a semiconductor component 13 is bonded to the circuit 40 such that the semiconductor component 13 is electrically connected to the first section 401 and the second section 402. Note that the first section 401 and the second section 402 are non-coplanar. In addition, before bonding the semiconductor component 130, a layer of gold or tin and a solder mask (not shown) may apply to the circuit 40.

Figure 14A:
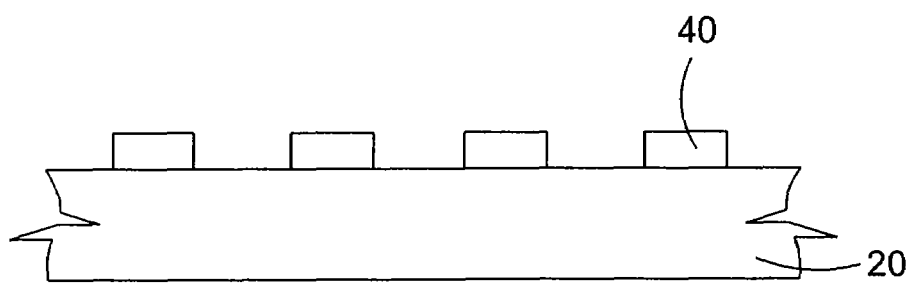
FIGS. 14A to 14C show the cross-sectional views of a molded circuit board during fabrication in accordance with a second embodiment of the present invention.
Figure 14B:
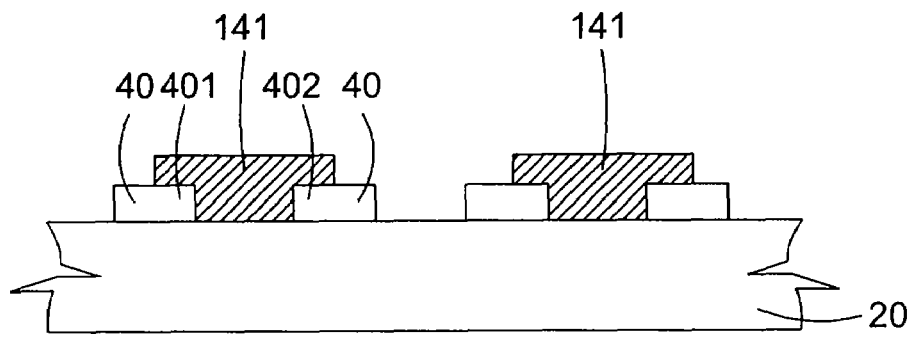
Figure 14C:
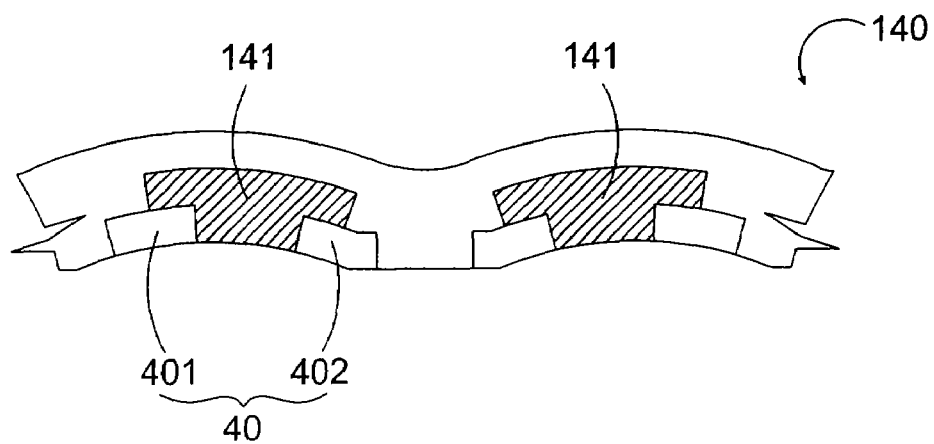

FIGS. 14A to 14C illustrate a second embodiment of the present invention. In comparison with the first embodiment, the second embodiment additionally includes a passive component 141 formed on the conductive substrate 20. The step is preferably preformed after forming the circuit 40 (as shown in FIG. 5) and before pressing the conductive substrate 20 (as shown in FIG. 8). Specifically, referring to FIG. 14A, the circuit 40 is formed on the conductive substrate 20. Then, referring to FIG. 14B, a passive component 141, such a capacitor or a resistor, is formed on the surface of the conductive substrate 20 by conventional screen-printing, dispensing process or any other suitable technique. The first section 401 and the second section 402 serve as electrodes to electrically connect with the passive component 141. The passive component 141 preferably includes flexible polymer thick films with conductive particles. After forming the passive component 141, the above-described mold-pressing and injection-molding processes are conducted following by removing the conductive substrate 20, and the resulted structure is a molded circuit board 140 as shown in FIG. 14C. Note that when the passive component 141 is first formed on the conductive substrate 20, the first section 401 and the second 402 are coplanar. After conducting a mold-pressing process as described above upon the conductive substrate 20, the first section 401 and the second section 402 become non-coplanar and the passive component 141 is concurrently bent to comply with the shape of the molds as shown in FIG. 14C.

Figure 15A:
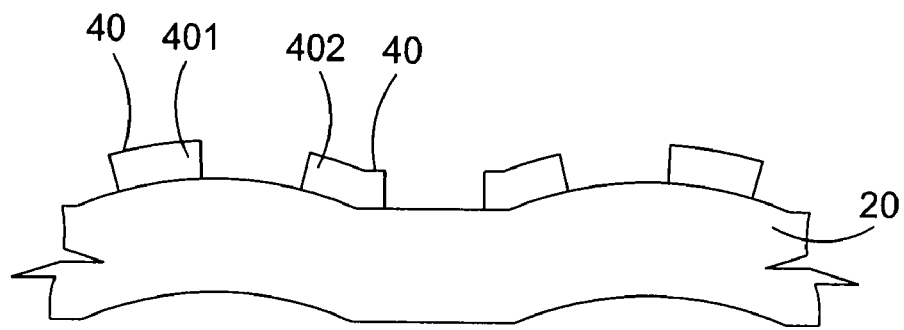
FIGS. 15A to 15C show the cross-sectional views of a molded circuit board during fabrication in accordance with a third embodiment of the present invention.
Figure 15B:
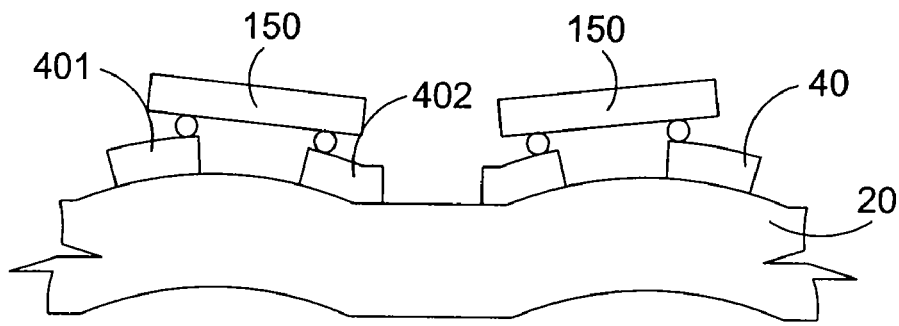
Figure 15C:
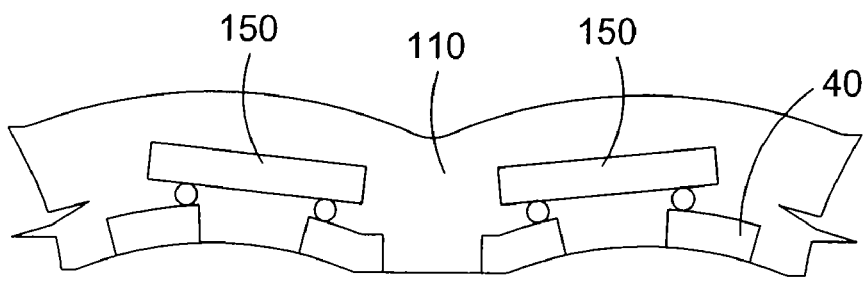

FIGS. 15A to 15C illustrate a third embodiment of the present invention. In comparison with the first embodiment, the third embodiment further includes forming an additional semiconductor component 150 on the conductive substrate 20. The step is preferably preformed after pressing the conductive substrate 20 (as shown in FIG. 8) and before conducting the injection molding (as shown in FIG. 10). Specifically, referring to FIG. 15A, the deformed substrate 20 with the circuit 40 thereon is provided. The circuit 40 includes the first section 401 and the second section 402, wherein both are non-coplanar at this point of time. Then, referring to FIG. 15B, a semiconductor component 150 is bonded to the first section 401 and the second section 402 of the circuit 40. Subsequently, the above-described injection-molding process is conducted to form a plastic material 110 cover for the circuit 40 and the semiconductor component 150. After the conductive substrate 20 is removed, a plastic substrate 110 with specific shape having the circuit 40 and the semiconductor component 150 embedded therein is shown in FIG. 15C.

Figure 16:
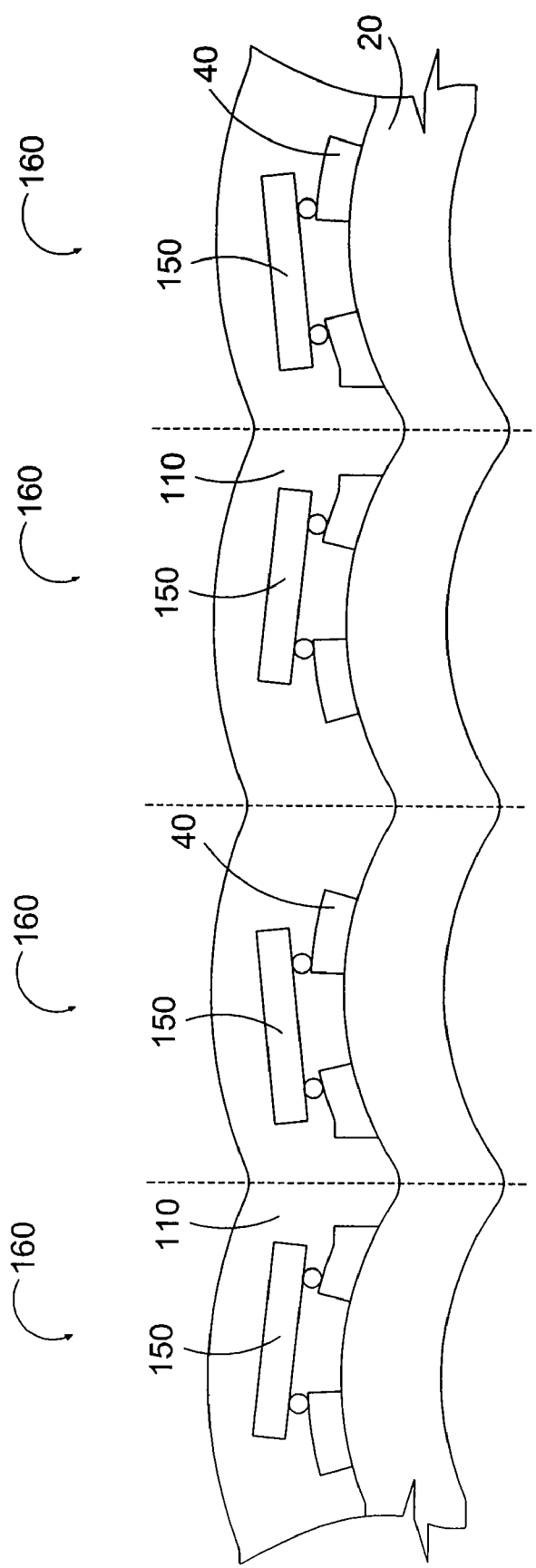
FIG. 16 shows a plurality of molded circuit boards formed on one conductive substrate in accordance with the present invention.

FIG. 16 shows a plurality of molded circuit boards 160 formed on one conductive substrate 20. After accomplishing the necessary steps as above-mentioned, the conductive substrate 20 can be removed. To obtain a single molded circuit board 160, the plastic substrate 110 can be divided into pieces along the dotted line as shown in FIG. 16.

Figure 17:
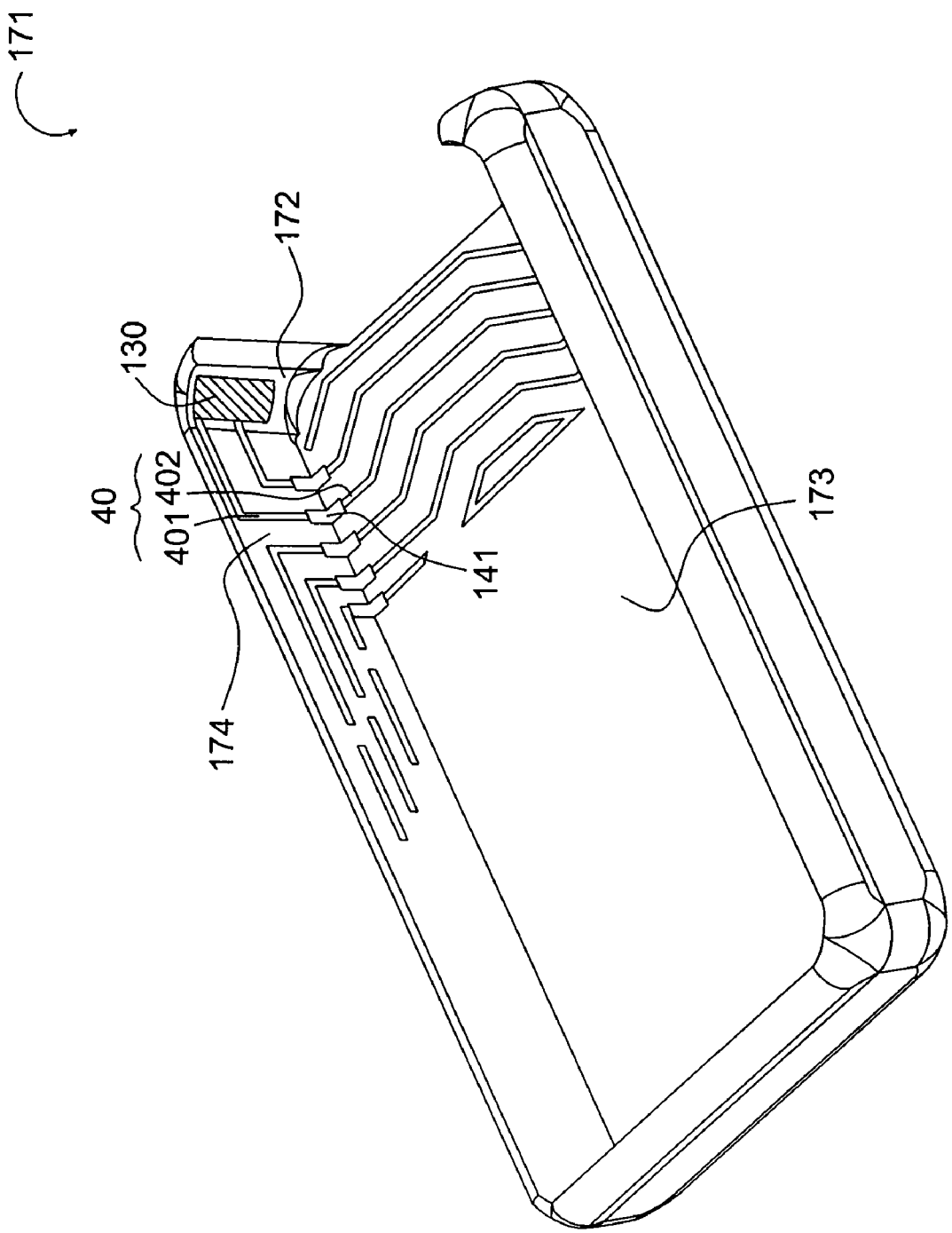
FIG. 17 shows a housing of a mobile phone in which the housing is a molded circuit board in accordance with the present invention.

FIG. 17 illustrates a housing 171 of a mobile phone wherein the housing 171 is a molded circuit board implemented the present invention. As shown in FIG. 17, the housing 171 includes the circuit 40 having the first section 401 and the second section 402, which are non-coplanar with each other and formed by mold-pressing as mentioned herein above. Note that a semiconductor component 130 is placed on a curved surface 172, and a passive component 141 is placed on both the surface 173 and the surface 174, which are non-coplanar with each other. In other words, by manipulating the contour of the plastic substrate, the molded circuit board of the present invention can function as a housing of any electronic device as appropriate.

The detailed description of the above preferable embodiments is provided to describe the technical features and spirit of the present invention, and the disclosed preferable embodiments are not intended to limit the scope of the present invention. On the contrary, the preferable embodiments and its variations or equivalents all fall within the scope of the present invention. Therefore, the scope of the present invention should be most broadly interpreted according to the foregoing description and includes all possible variations and equivalents.

I claim:

1. A method for forming a molded circuit board, comprising:
    providing a conductive substrate;
    forming a circuit having a first section and a second section on the conductive substrate, the first section and the second section being coplanar;
    deforming the conductive substrate to make the first section and the second section non-coplanar by pressing the conductive substrate with a first lower mold and a first upper mold;
    after deforming the conductive substrate, bonding a first semiconductor component to the circuit, wherein the first semiconductor component is electrically connected with the first section and the second section;
    providing a plastic material by injection-molding, the plastic material covering the deformed conductive substrate, the circuit, and the first semiconductor component;
    curing the plastic material to form a plastic substrate with the circuit and the first semiconductor component therein;
    after form the plastic substrate, removing the conductive substrate to expose the circuit; and
    after removing the conductive substrate, bonding a second semiconductor component to the circuit, wherein the second semiconductor component is electrically connected with the first section and the second section.

2. The method accordingly to claim 1, further comprising forming a passive component on the conductive substrate prior to pressing the conductive substrate, wherein the passive component is electrically connected with the circuit.

3. The method according to claim 2, wherein the passive component comprises flexible polymer thick films with conductive particles.

4. The method accordingly to claim 1, further comprising applying an organic adhesive layer to the circuit prior to pressing the conductive substrate.

5. The method according to claim 1, wherein the injection molding comprises:
    placing the conductive substrate with the circuit between a second lower mold and a second upper mold; and
    injecting the plastic material into a space between the conductive substrate and the second upper mold, wherein the second upper mold defines the contour of the plastic substrate.

6. The method according to claim 1, further comprising plating an etching stop layer on the conductive substrate using a patterned photoresist layer as a mask prior to plating the circuit.

7. The method according to claim 1, further comprising plating a barrier layer on the circuit using a patterned photoresist layer as a mask.

* * * * *